US007277348B2

(12) United States Patent
Peng et al.

(10) Patent No.: US 7,277,348 B2
(45) Date of Patent: Oct. 2, 2007

(54) MEMORY CELL COMPRISING AN OTP NONVOLATILE MEMORY UNIT AND A SRAM UNIT

(75) Inventors: Jack Zezhong Peng, San Jose, CA (US); David Fong, Cupertino, CA (US); Harry Shengwen Luan, Saratoga, CA (US); Jianguo Wang, Cupertino, CA (US); Zhongshang Liu, Plano, TX (US)

(73) Assignee: KLP International, Ltd., Santa Clara, CA (US)

( * ) Notice: Subject to any disclaimer, the term of this patent is extended or adjusted under 35 U.S.C. 154(b) by 59 days.

(21) Appl. No.: 11/356,805

(22) Filed: Feb. 17, 2006

(65) Prior Publication Data

US 2007/0133334 A1 Jun. 14, 2007

Related U.S. Application Data

(60) Provisional application No. 60/749,551, filed on Dec. 12, 2005.

(51) Int. Cl.
*G11C 17/18* (2006.01)

(52) U.S. Cl. .................... 365/225.7; 365/149; 365/129

(58) Field of Classification Search ............. 365/225.7, 365/149, 129, 185.28, 185.05, 185.01, 185.14, 365/189.05, 189.08
See application file for complete search history.

(56) References Cited

U.S. PATENT DOCUMENTS 6,914,842 B2 * 7/2005 Huang et al. ............ 365/225.7
7,064,973 B2 * 6/2006 Peng et al. ................. 365/149

* cited by examiner

*Primary Examiner*—Tuan T. Nguyen
*Assistant Examiner*—Dang Nguyen
(74) *Attorney, Agent, or Firm*—Perkins Coie LLP

(57) ABSTRACT

Memory cells including an SRAM and an OTP memory unit that combine the advantages of both technologies and can be fabricated by standard CMOS manufacturing without additional masking. The concepts and details may be applied to and utilized in other systems requiring memory and/or employing other fabrication technologies. Among other advantages, the SRAM part of memory cells allows countless programming of the cell, which is useful, for example, during the prototyping. The OTP part is utilized to permanently program the memory cell by either using external data or the data already existing in the SRAM part of the cell. The value held by the OTP unit may also be written directly into the SRAM part of the cell.

24 Claims, 17 Drawing Sheets is
bl
(OTP)
wp
Tcp
111
(5 T SRAM)
Inv2
Tis
Inv1
115
119
Tlc
Vcn
(FPGA Switch)
120
CN
Tsl
Tsw
wr
117
wlc

MEMORY CELL COMPRISING AN OTP NONVOLATILE MEMORY UNIT AND A SRAM UNIT

CROSS-REFERENCE TO RELATED APPLICATION(S)

The present application claims the benefit of U.S. Provisional Patent Application Ser. No. 60/749,551, filed Dec. 12, 2005, entitled "KLP LOGIC".

TECHNICAL FIELD

The embodiments of the present invention relate in general to memory cells, and more particularly, to a combination of OTP and SRAM technologies for field programmable gate arrays (FPGAs).

BACKGROUND

Field programmable gate arrays (FPGAs) are commonly used in many applications that require complex logic functions and are finding increasing application as logic and processing elements. In general, FPGAs are comprised of logic heads/cells arranged in a repeating manner and interconnect structures that route signals between the various cells. FPGAs can either be permanently or temporarily programmed by the user.

Functions are implemented in FPGAs by setting the states of programmable elements such as memory cells that set the functionality of the circuit. Memory cells may be used to programmmably control the composition, configuration, arrangements, and also the interconnections of logic array blocks and logic elements. These memory cells may be implemented with volatile memories, which lose their programmed states upon termination of power to the system, or with nonvolatile memories, which retain their contents upon termination of power. If the programmable elements used are volatile memories, the memory cells must be reconfigured upon system power-up in order to restore the FPGA to the desired programmed and functional state. As integrated circuit technology and semiconductor processing continue to advance there is a need for greater densities and functionality in integrated circuits, which are often determined in large part by the size of the memory cells used to create the circuit.

Many different memory cell technologies may be used including DRAM, SRAM, EPROM, EEPROM, Flash, and antifuse, among others. A technology for storing the configuration information of the FPGA should be compact, power efficient, programmable, reprogrammable, reconfigurable, and nonvolatile, require little additional programming circuitry overhead and generally provide enhancements to the performance and features of FPGA logic modules and interconnections. Further, it is desirable that the memory cells have improved operating characteristics, such as greater device longevity, improved data retention, better transient performance, superior voltage and current attributes, and improvements in other similar attributes.

Traditionally FPGAs have either employed a volatile or a nonvolatile technology, each of which has its own advantages and disadvantages. For example, in the case of power interruption, volatile memory cells need their information to be restored and reconfigured. Volatile memory also has a slower power-up time than nonvolatile technology. Volatile memory also needs higher standby power and typically requires external intelligence for configuration. In contrast, nonvolatile memory cells, which is required or at least highly desirable in many different electronic devices, are not easily reconfigurable, require nonstandard semiconductor processes, have a slow programming or "write" capability, and may not be testable during manufacturing.

DETAILED DESCRIPTION

Figure 1:
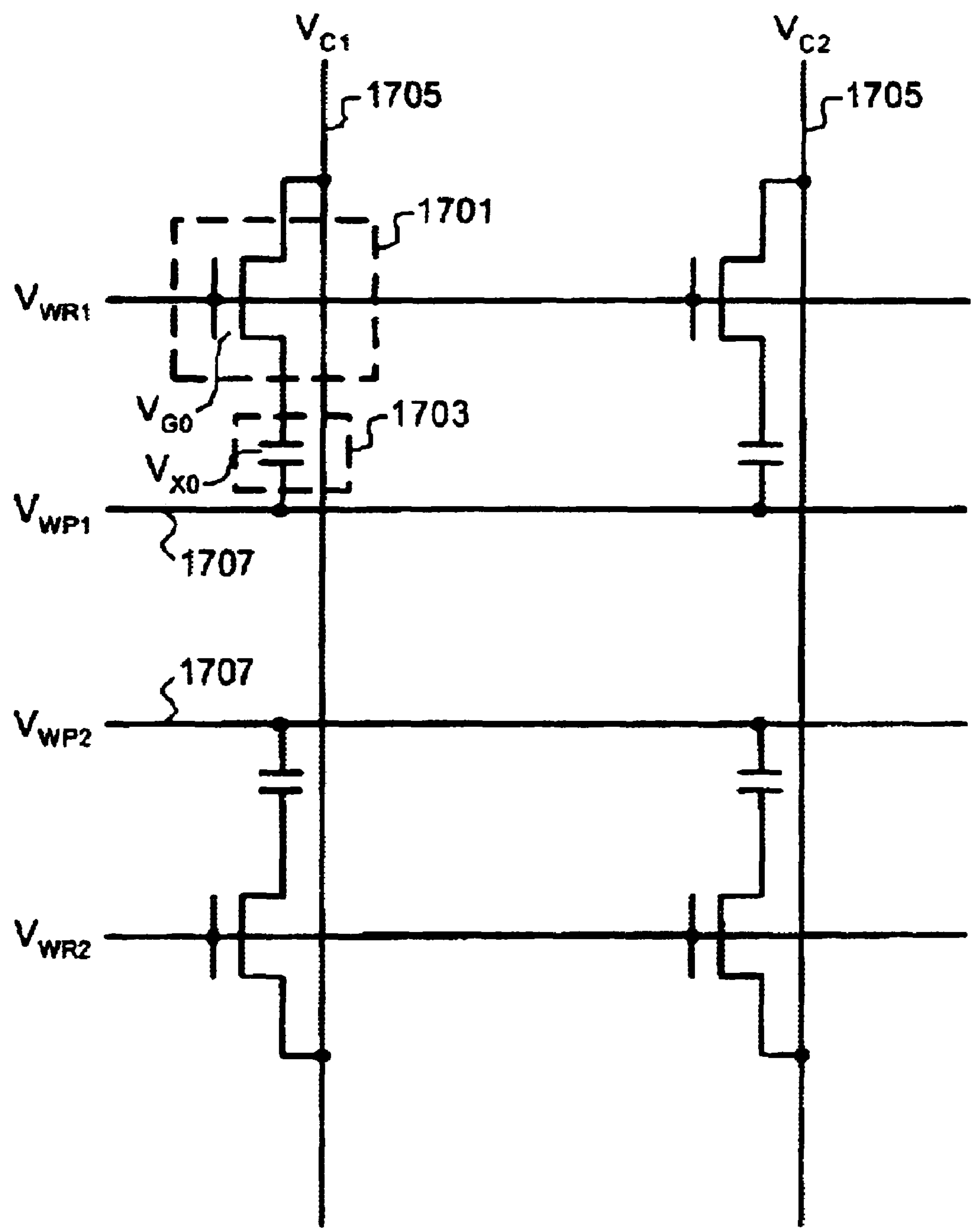
FIG. 1 is a schematic circuit diagram of a 4×4 portion of a memory array using nonvolatile OTP memory units.

Memory cells may be used to programmably control the composition, configuration, arrangements, and also the interconnections of logic array blocks and logic elements in FPGAs. As integrated circuit technology and semiconductor processing continue to advance, there is a need for greater densities and functionality in integrated circuits, which are often determined in large part by the size of the memory cells used. To date, FPGAs have either employed a volatile or a nonvolatile technology, each of which has its own disadvantages that cannot be overcome except by switching to the other technology.

The embodiments disclosed herein, utilize a combination of an SRAM and an OTP memory unit to combine the advantages of both technologies. While these embodiments are being presented in the context of FPGAs and readily lend themselves to standard CMOS manufacturing, the disclosed concepts and details may be applied to and utilized in other systems requiring memory and/or employing other fabrication technologies.

The SRAM part of disclosed memory cells allows countless programming and reprogramming of the cell, which is very useful, for example, during prototyping. The OTP portion may be utilized to permanently program the cell by either using external data or the data already existing in the SRAM part of the cell. The value held by the OTP unit may also be directly written into the SRAM part of the cell. Figures of the described embodiments merely illustrate aspects of the memory cells associated with FPGAs and do not explore FPGAs any further.

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Reference throughout the specification to “one embodiment” or “an embodiment” means that a particular feature, structure, implementation, or characteristic described in connection with the embodiment is included in at least one embodiment of the present invention. Thus, uses of the phrases “in one embodiment” or “in an embodiment” in various places throughout the specification are not necessarily all referring to the same embodiment. Furthermore, the particular features, structures, implementation, or characteristics may be combined in any suitable manner in one or more embodiments.

Nonvolatile OTP Part of the Memory Cells

The basic building block of a nonvolatile OTP memory unit has been discussed in detail in the U.S. Pat. No. 6,667,902, granted to Jack Zezhong Peng (“Peng”) and is illustrated in an arbitrary 4×4 array of such units in FIG. 1. As depicted in FIG. 1, Peng discloses a nonvolatile OTP memory unit at the crosspoint of the first row $R_1$ and the first column $C_1$ that comprises one n-channel MOS transistor 115 in series with a half-transistor 111, both which can be fabricated using standard CMOS processes without any additional masking. The gate of transistor 115 is connected to the row line $R_1$, its source to the source line $S_1$, and its drain to one terminal of the half-transistor 111. In other embodiments a floating gate device may be employed to replace the half-transistor. Transistor 115 is also referred to as a select transistor and is used to “select” a particular memory cell for programming or reading.

During a programming step, a large voltage is applied to the gates of the select transistor 115 and the half-transistor 111 to break down the gate oxide of the half-transistor 111 and to set the leakage current level of the memory cell. The memory cell is read by sensing the current drawn by the cell. The gate of the half-transistor 111 acts as one plate of a capacitor and the application of the voltage to the gate causes an n-type inversion layer to form under the gate which acts as the other plate of the capacitor, and together with the source/drain region forms the second terminal of the capacitor. Since it is undesirable to break down the gate oxide of the select transistor 115, the gate oxide of the select transistor 115 may be made, in some embodiments, to have a thicker gate oxide than that of the half-transistor 111.

A broken-down half-transistor acts as a resistor and limits the passage of current through the half-transistor, which can be sensed and used to identify a broken-down (programmed) transistor. A broken-down half-transistor is used to represent one binary logic level, while an intact half-transistor is used to represent the other logic level.

SRAM Part of the Memory Cells

A memory cell based on a nonvolatile OTP unit alone has the disadvantage of being one time programmable. Even a combination of the nonvolatile OTP memory unit and a dynamic RAM has the disadvantage of consuming power and causing noise that may disturb the FPGA logic circuits. The combination of a nonvolatile OTP unit and an SRAM unit forms a memory cell which can be randomly loaded, virtually unlimited number of times, and/or be permanently programmed when an SRAM code is finalized. The OTP part of the cell can be programmed either using the content of the SRAM part or using outside data. The SRAM part of the cell can also be written into using either the content of the OTP part or using outside data. In volume production, the SRAM parts may be eliminated where only permanent programming is desired.

Memory Cell with OTP and SRAM Parts

Figure 2:
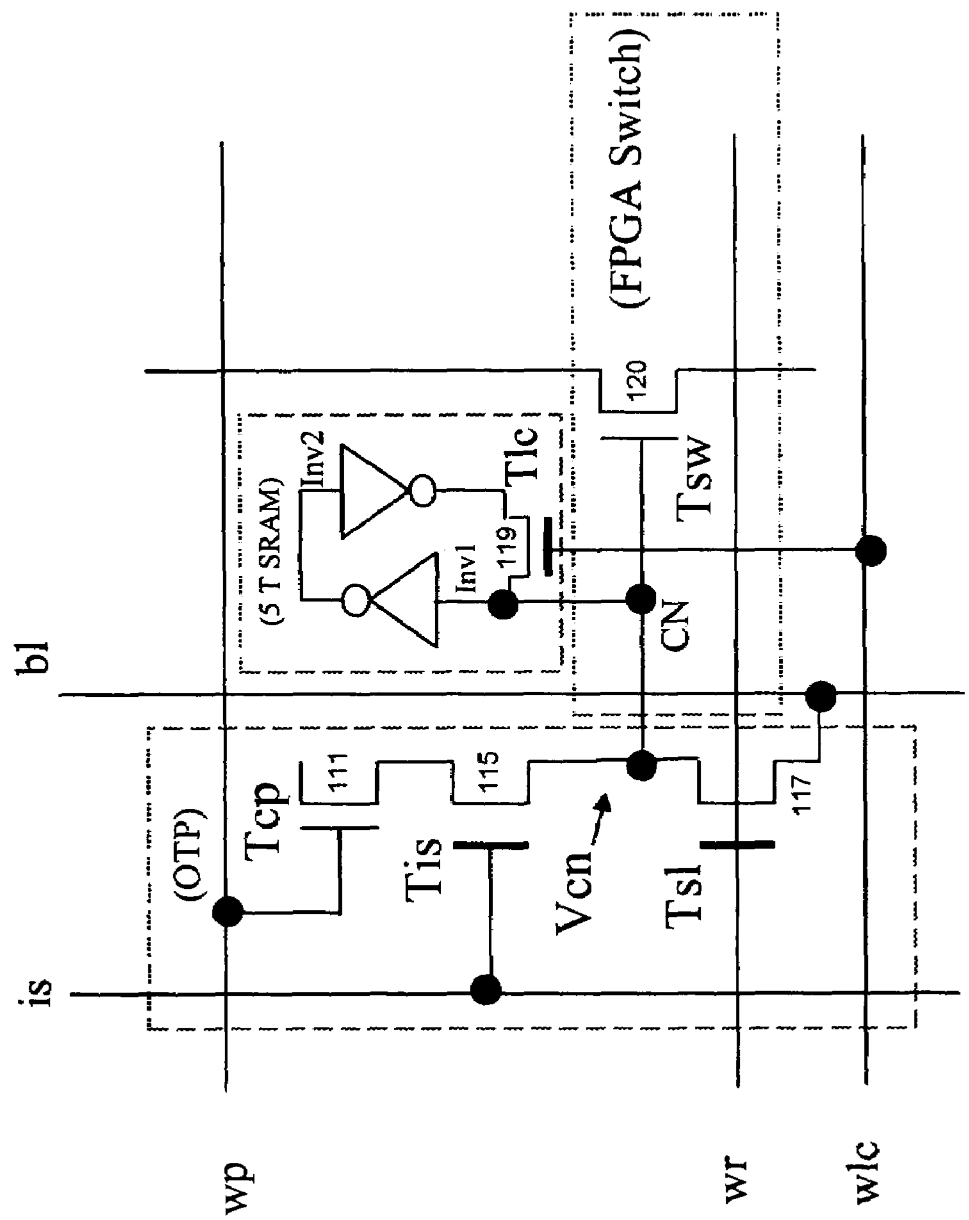
FIG. 2 is a schematic circuit diagram of a memory cell of an FPGA, utilizing a combination of a nonvolatile OTP memory unit and a SRAM unit, in accordance with an embodiment of the invention, wherein an FPGA switch is shown being controlled by the data content of the memory cell.

FIG. 2 is a schematic circuit diagram of a memory cell of an FPGA, utilizing a combination of a nonvolatile OTP memory unit and an SRAM unit, in accordance with an embodiment of the invention, wherein an FPGA switch is shown being controlled by the data content of the memory cell. In the embodiment depicted in FIG. 2, for read and write and other purposes that will be described in detail below, an additional transistor 117 is connected in series to transistor 115. In some embodiments, the SRAM is a loop comprising two inverters Inv1 and Inv2 and a transistor 119 (Tlc), all in series. The SRAM construction depicted in FIG. 2 can also be described as a transistor in the loop of two cross-coupled inverters.

As depicted in FIG. 2, the gate of the half-transistor 111 (Tcp) is connected to the word-programming signal line “wp,” the gate of transistor 115 (Tis) is connected to the isolation signal line “is,” the gate of transistor 117 (Tsl) is connected to the word-read signal line “wr,” and the gate of the SRAM transistor 119 (Tlc) is connected to the word-latch signal line "wlc." Furthermore, the gate of transistor 120 (Tsw), which is the FPGA switch, is connected to the connection point of transistors 115 and 117 (control node CN) and the connection point of the SRAM transistor 119 and the input of the inverter Inv1 (CN). The other side of transistor 117 that is not connected to transistor 115 is connected to the bit signal line "bl."

In this embodiment, as an example, Tcp and Inv1 and Inv2 and Tsw are 1.8V devices (Gox~30A physical) and Tis, Trd and Tlc are 3.3V devices (Gox 60~75A). In other embodiments Tsl, Tlc and/or Tis can be 1.8V devices or same devices as Tcp, Ivn1, Inv2 and Tsw. The logic signal passes through Tsw (Vlogic)=Vcn−Vtsw in order to pass full logic "1," where Vcn is the control node voltage and Vtsw is the voltage at the gate of transistor 120. The oxide thickness and voltages can be scaled up and down according to different process technologies and applications.

Figure 3:
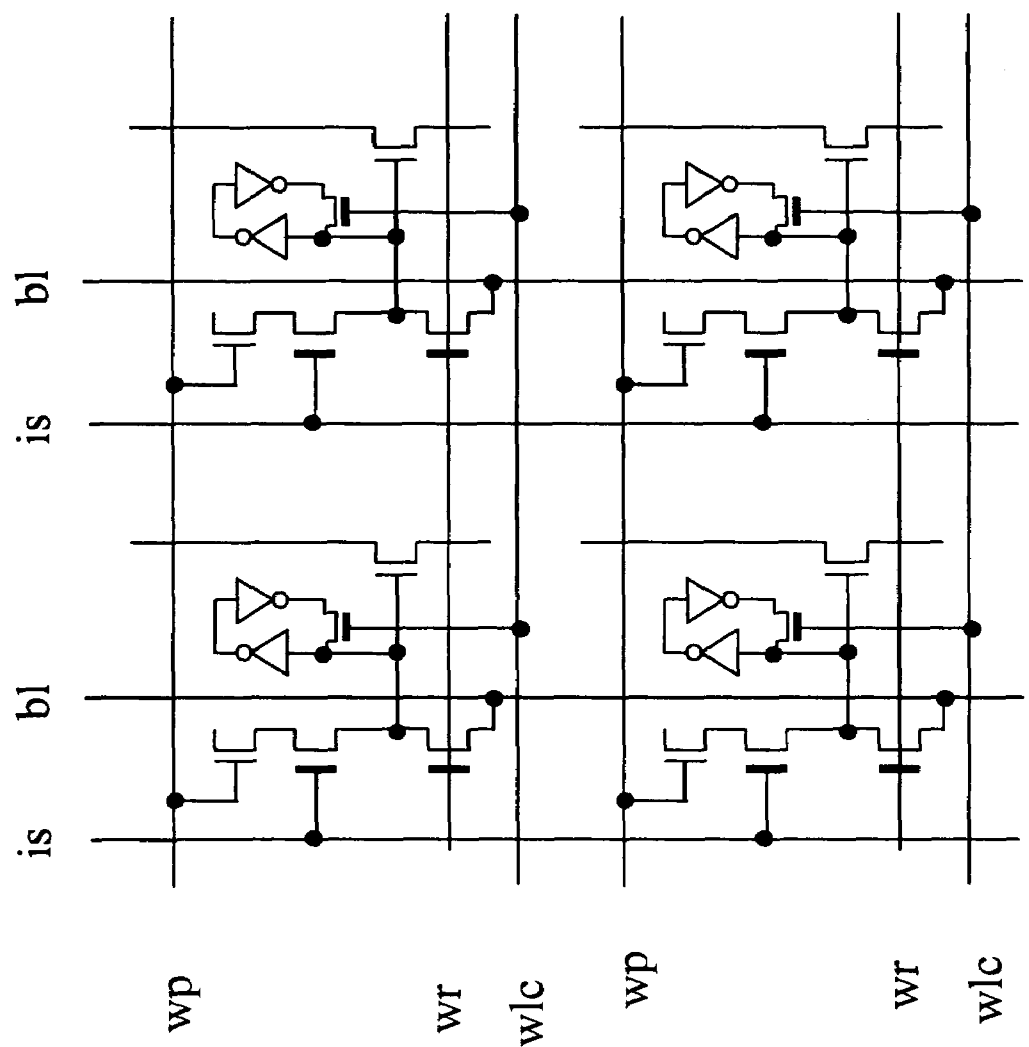
FIG. 3 is a schematic circuit diagram of a 2×2 portion of a memory array of an FPGA, utilizing the memory cell depicted in FIG. 2.
Figure 4:
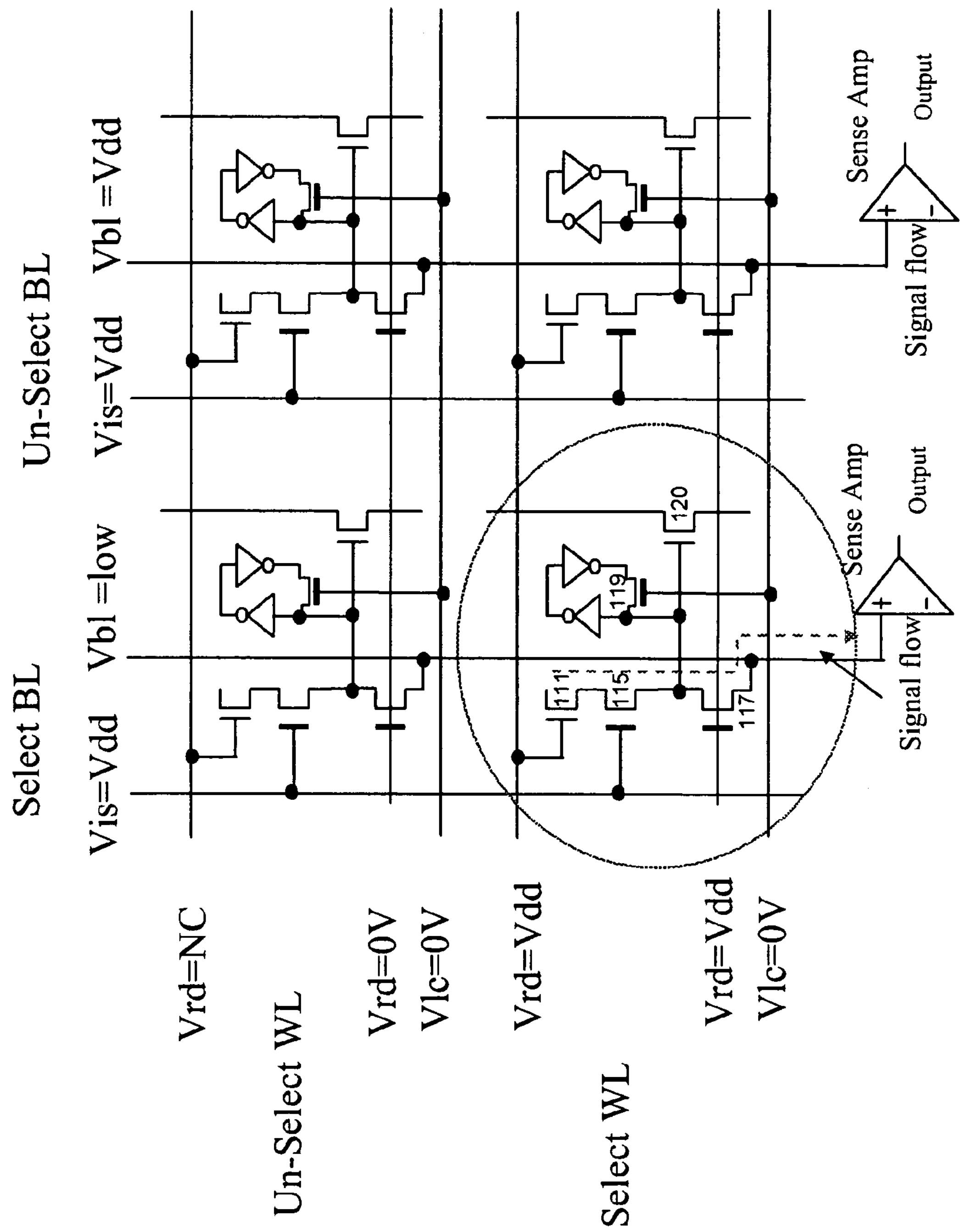
FIG. 4 is a schematic circuit diagram showing an example of an OTP read operation in a 2×2 portion of a memory array of an FPGA, utilizing the memory cell depicted in FIG. 2.

FIG. 3 is a schematic circuit diagram of a 2×2 portion of a memory array utilizing the memory cell of FIG. 2. The signal lines may be manipulated to read or program one memory cell or several cells at a time. FIG. 4 depicts an example of such signal line manipulation where the memory content of the OTP part of one of the memory cells is being read (sensed). In this example, to read the memory content of the OTP part of a particular memory cell, the gates of the half-transistor 111 and transistors 115 and 117 are connected to $V_{dd}$ and the gate of transistor 119 is connected to ground (zero voltage) and the other signal lines are set as in FIG. 4. In this configuration a current limited by the half-transistor 111 will pass through transistors 115 and 117 and the signal line bl and is measured by a sense amplifier, which will indicate whether the gate oxide of the half transistor 111 has been broken down, and which indicates the data coding of the OTP.

Figure 5:
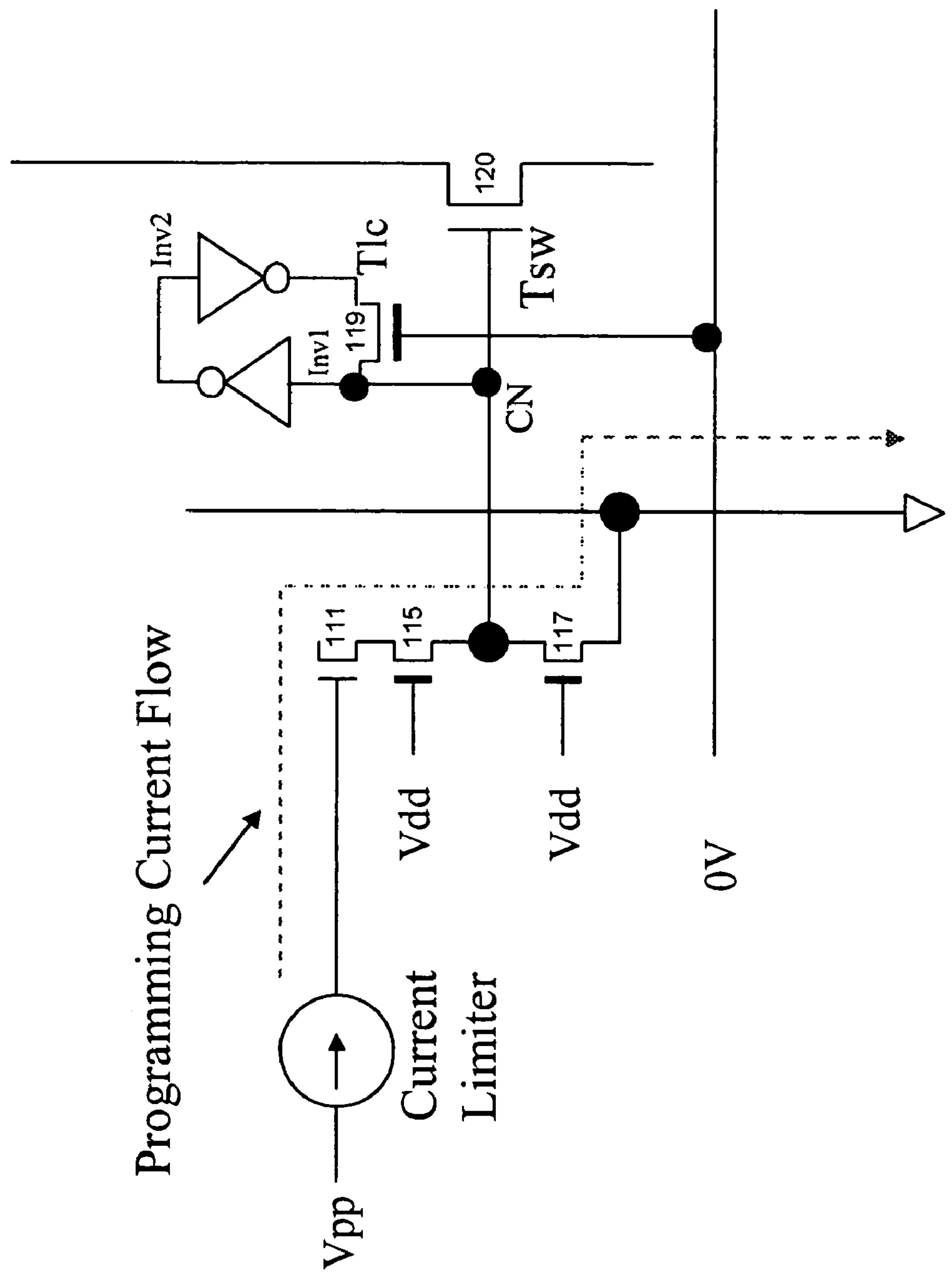
FIG. 5 is a schematic circuit diagram showing an OTP programming operation in the memory cell depicted in FIG. 2.

FIG. 5 is a schematic circuit diagram showing an OTP programming operation. As depicted in FIG. 5, to break down the gate oxide of half-transistor 111, the gates of transistors 115, and 117 are connected to $V_{dd}$ and the bl signal line is connected to the ground. With such arrangement one terminal of the capacitor made by the half transistor 111 is connected to ground and the controlled high voltage $V_{pp}$ at the other terminal controlably breaks down the gate oxide of the transistor 111 and will program the OTP unit. During this programming process the gate of transistor 119 is also grounded to open the SRAM loop and disable the SRAM part.

Figure 6:
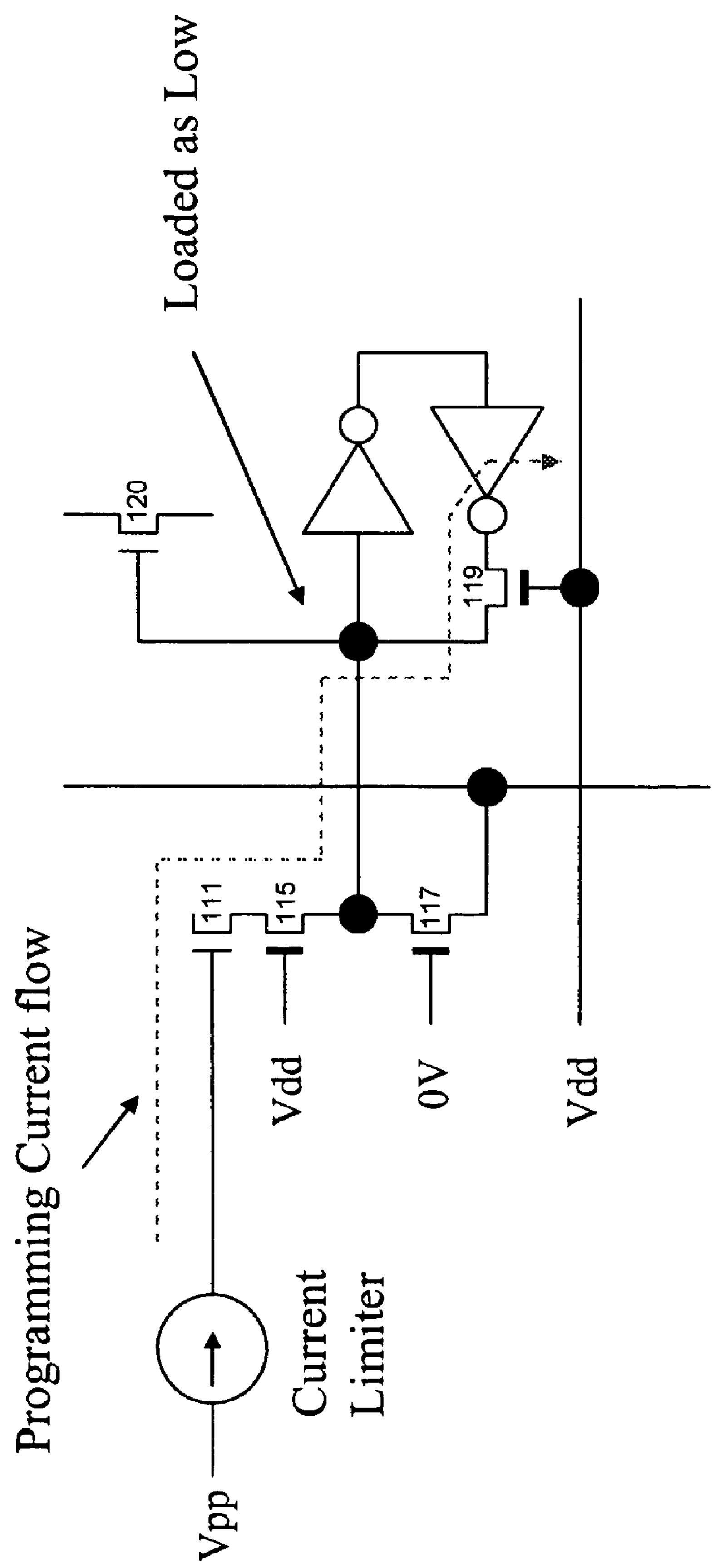
FIG. 6 is a schematic circuit diagram showing an OTP programming operation in the memory cell depicted in FIG. 2, wherein the data in the SRAM part is utilized to program the OTP part.

FIG. 6 is a schematic circuit diagram showing an OTP programming operation, wherein the data in the SRAM part is utilized to program the OTP part. In this configuration, by turning ON transistors 115 and 119 and turning OFF transistor 117, one terminal/plate of the capacitor made by the half-transistor 111 will be connected to the stored voltage of the SRAM. Therefore, if the other terminal, which is the gate of the half-transistor 111, is connected to the controlled voltage $V_{pp}$, the breakdown of the half-transistor 111 will depend on the voltage stored in the SRAM. In other words, with such arrangement of signal line voltages, the programming of the half-transistor 111 will be the direct result of the SRAM data content.

Figure 7:
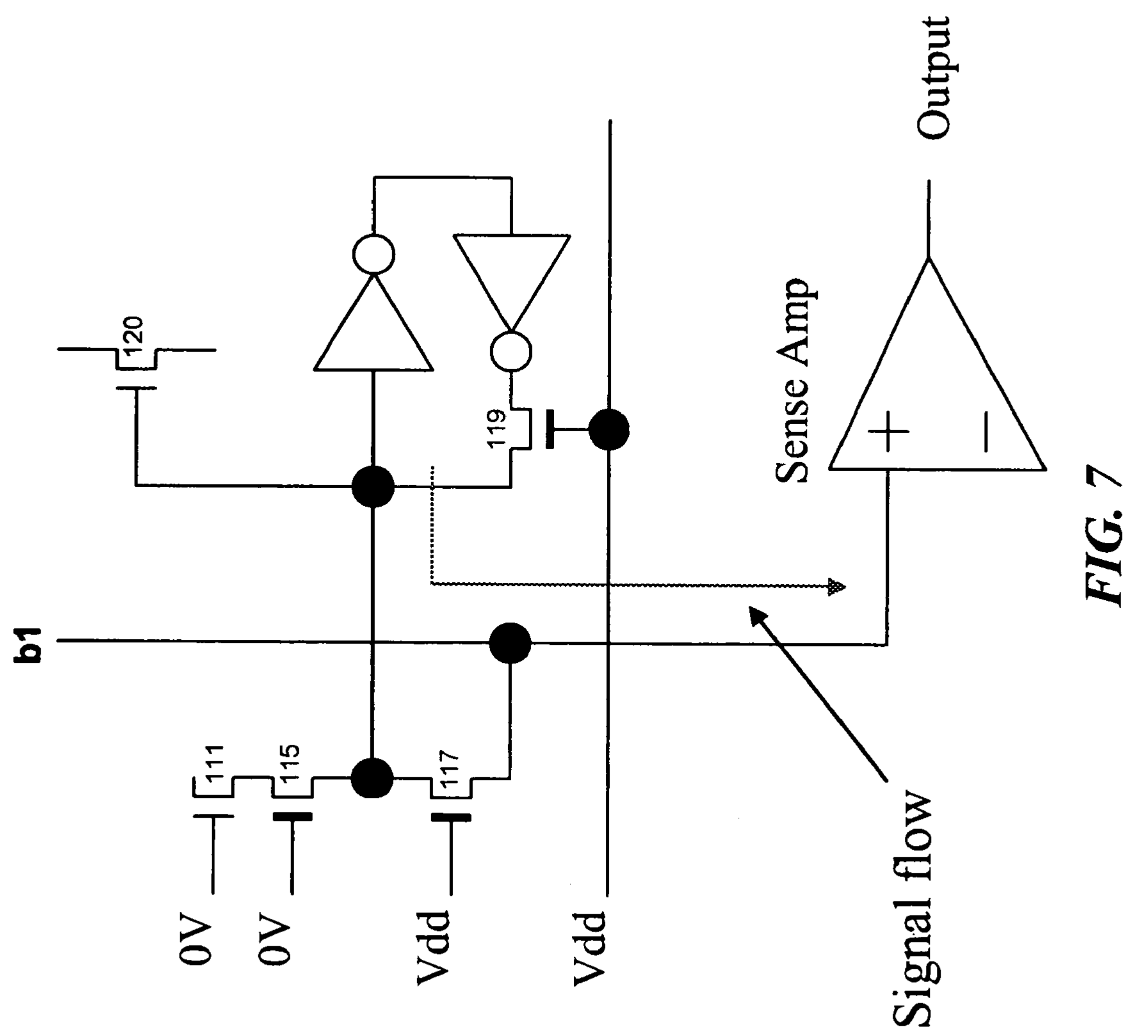
FIG. 7 is a schematic circuit diagram showing an SRAM read operation in the memory cell depicted in FIG. 2.

FIG. 7 is a schematic circuit diagram showing an SRAM read operation. In the arrangement depicted in FIG. 7, the transistor 115 is OFF and transistors 117 and 119 are both ON. In this situation the data content of the SRAM can be sensed through transistor 117 and the bl signal line.

Figures 8A, 8B:
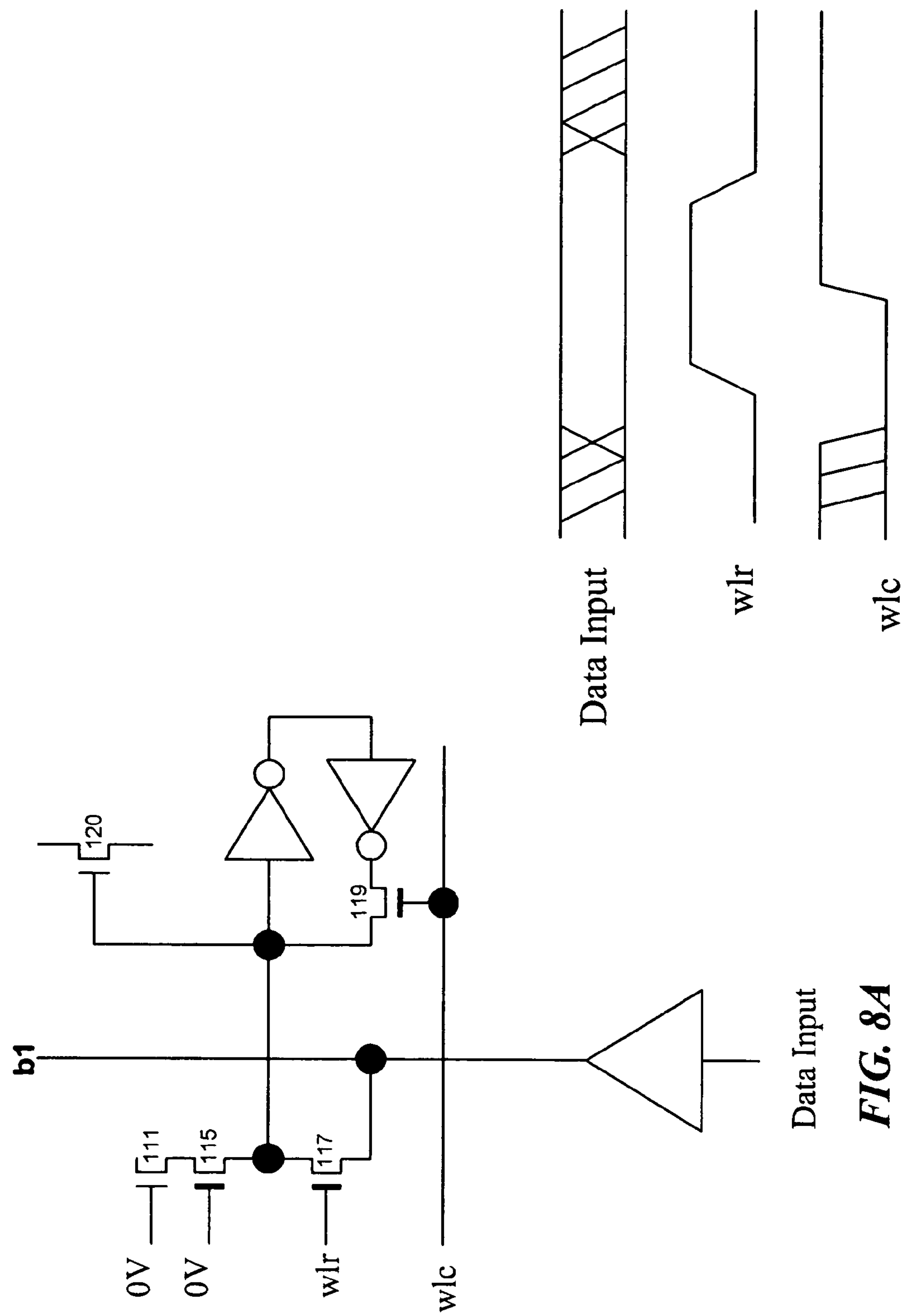
FIG. 8A is a schematic circuit diagram showing an SRAM write operation using external data, in the memory cell depicted in FIG. 2.
FIG. 8B depicts an appropriate signal timing for such write operation.

FIG. 8A is a schematic circuit diagram showing an SRAM write operation using external data. The arrangement of the signals in FIG. 8A is very similar to the arrangement of FIG. 7, with the difference that instead of reading the data content of the SRAM, data is written into the SRAM via the bl signal line and through transistor 117. In FIG. 8A, as in FIG. 7, the half-transistor 111 is isolated from the SRAM part by turning OFF transistor 115. FIG. 8B depicts the appropriate signal timing for such write operation.

Figures 9A, 9B:
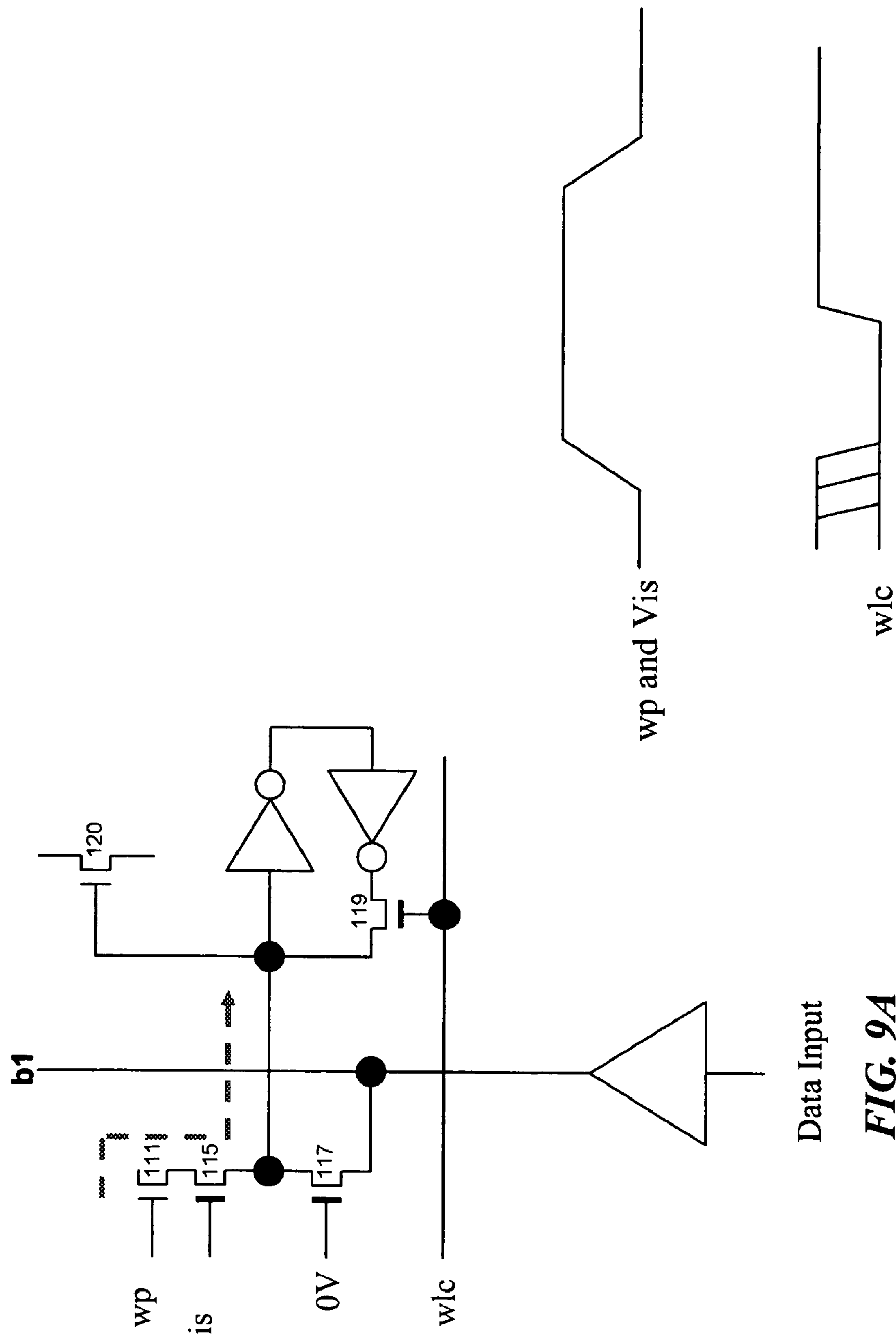
FIG. 9A is a schematic circuit diagram showing an SRAM write operation in the memory cell depicted in FIG. 2, wherein the data in the OTP part is utilized to program the SRAM part.
FIG. 9B depicts an appropriate signal timing for such write operation.

FIG. 9A is a schematic circuit diagram showing an SRAM write operation using the data in the OTP part. In this arrangement, appropriate voltage is applied to the gate of the half-transistor 111. Transistor 115 is turned ON to connect the half-transistor 111 to the SRAM part. Transistor 119 is then turn on to lock the data in the SRAM, and transistor 117 is turned OFF to disconnect the bl signal line from the SRAM part. FIG. 9B depicts the appropriate signal timing for such write operation.

Figure 10:
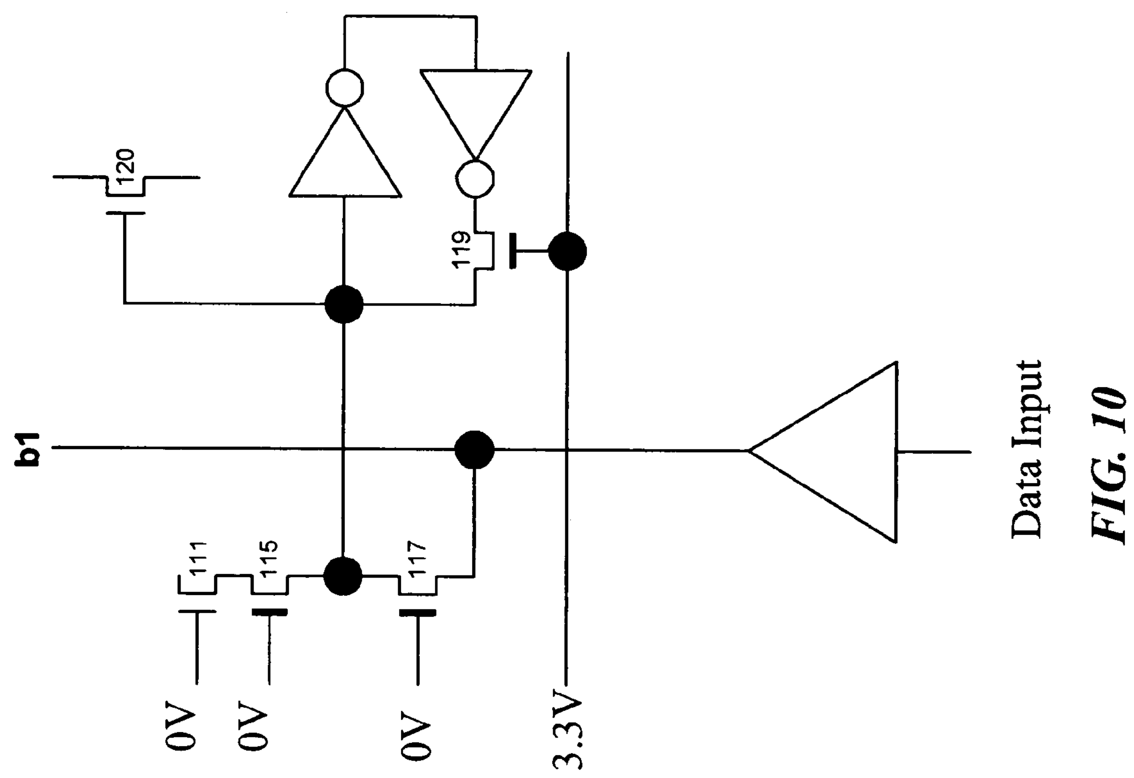
FIG. 10 is a schematic circuit diagram showing an arrangement for controlling the FPGA switch by the content of the SRAM part, in the memory cell depicted in FIG. 2.

FIG. 10 is a schematic circuit diagram showing an arrangement for controlling the FPGA switch by the content of the SRAM. In the arrangement of FIG. 10, the gate of the half-transistor 111 is connected either to the ground or Vcc. Transistors 115 and 117 are turned OFF to disconnect the control node CN from the half-transistor 111 and from the bl signal line. Transistor 119 is turned ON to connect the content of the SRAM (the control node CN) to the gate of transistor 120 (the FPGA switch).

Figure 11:
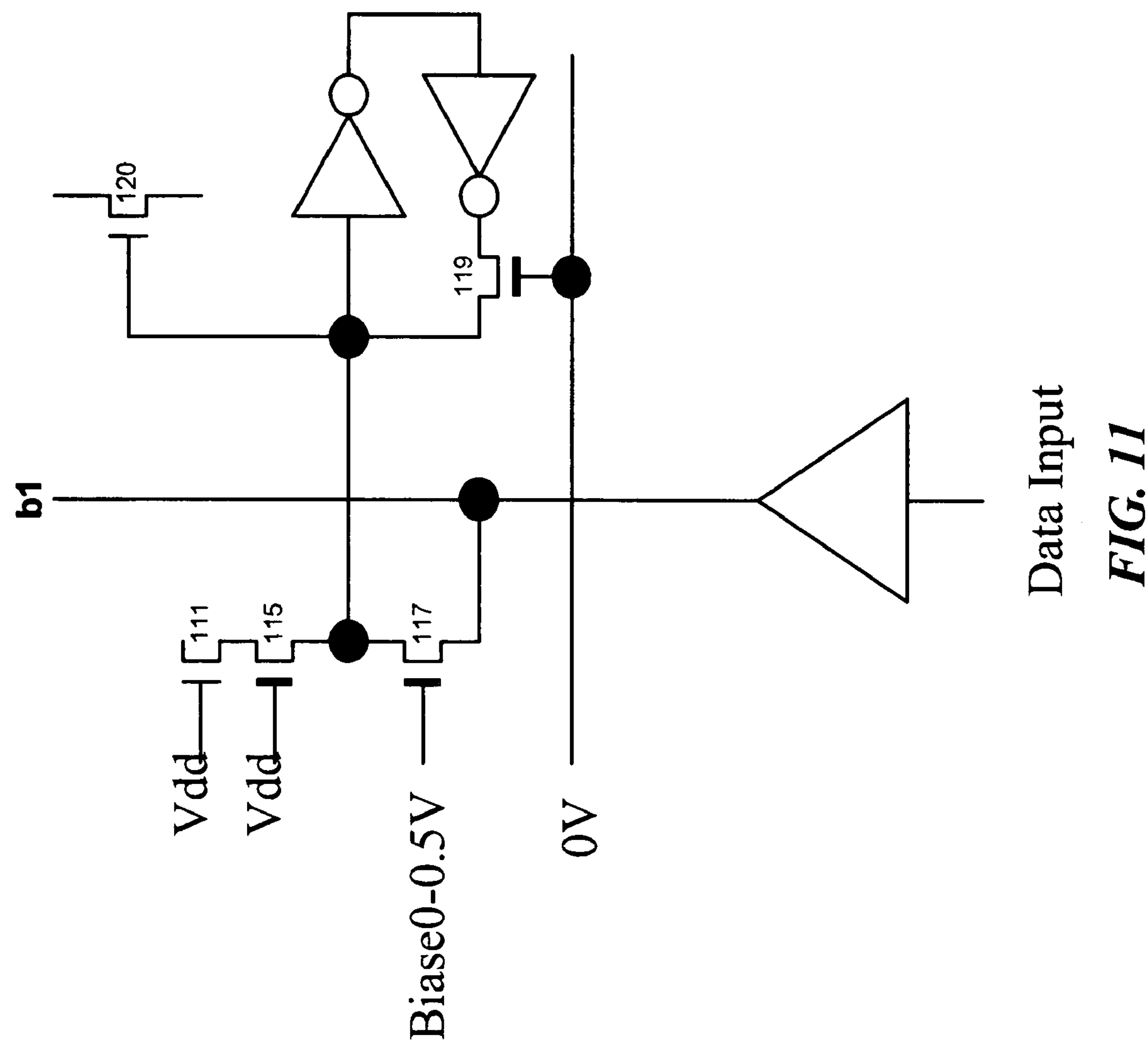
FIG. 11 is a schematic circuit diagram showing an arrangement for controlling the FPGA switch by the content of the OTP part, in the memory cell depicted in FIG. 2.

FIG. 11 is a schematic circuit diagram showing an arrangement for controlling the FPGA switch by the content of the OTP part. In this arrangement, in contrast with the arrangement of FIG. 10, gate voltages are so chosen as to connect the half-transistor 111 to the control node CN and to disable the SRAM part by opening its loop and disconnecting the bl signal line from the control node CN. As can be seen from FIG. 11, these connections and disconnections are achieved by turning ON transistor 115 and turning OFF transistors 117 and 119.

Figure 12:
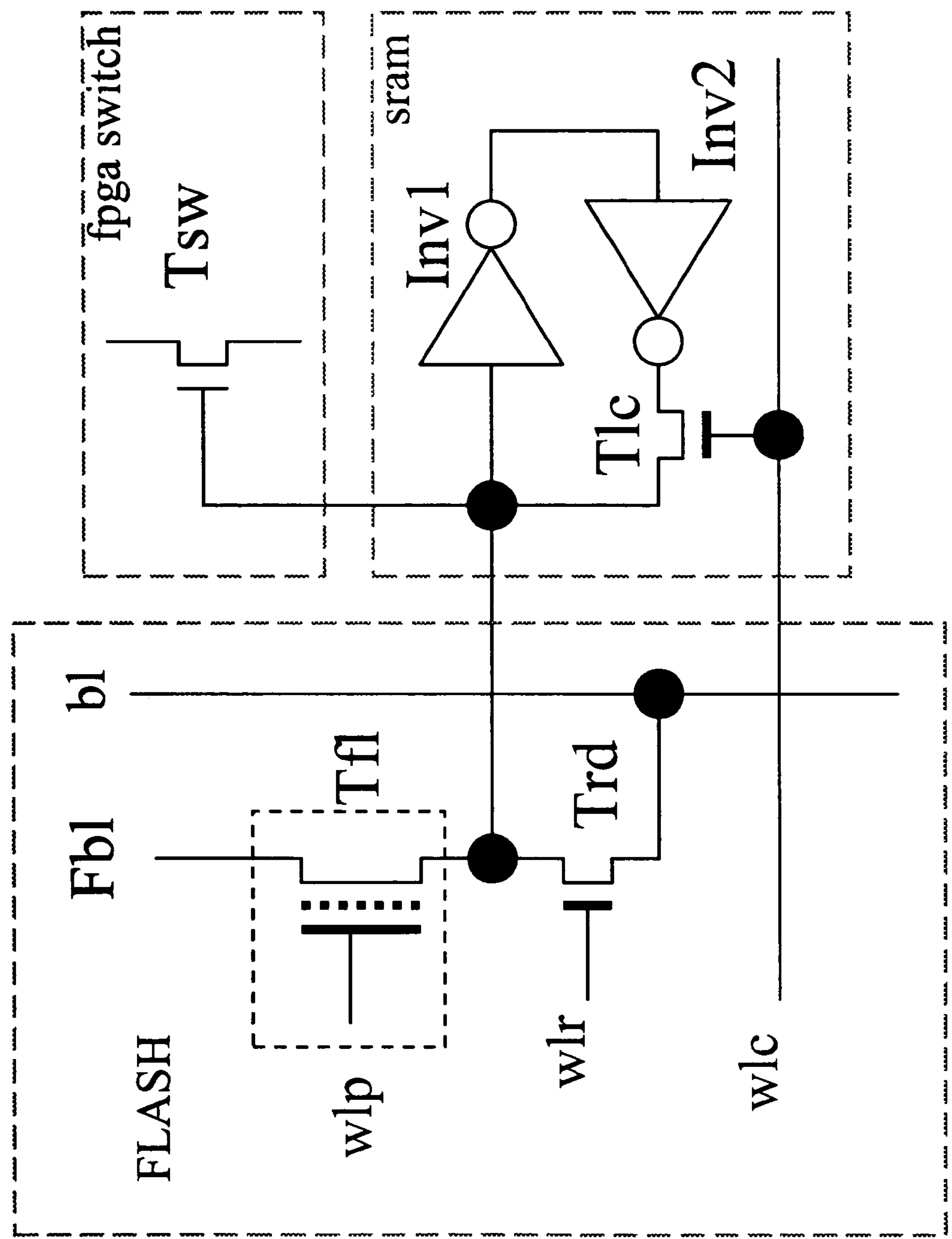
FIG. 12 is a schematic circuit diagram showing the memory cell of FIG. 2, wherein the half-transistor and the series transistor of the OTP part is replaced by a floating gate device.

FIG. 12 is a schematic circuit diagram showing the memory cell of FIG. 2, wherein the half-transistor 111 and the series transistor 115 of the OTP part is replaced by a floating gate device Tfl. The nonvolatile device of Tfl can replace any 4 terminal nonvolatile device (one control gate, one source, one drain, one substrate or well) or 5 terminal nonvolatile device (two control gates, one source, one drain, one substrate or well). The nonvolatile device Tfl can easily be extended from N Type to P Type.

Figure 13:
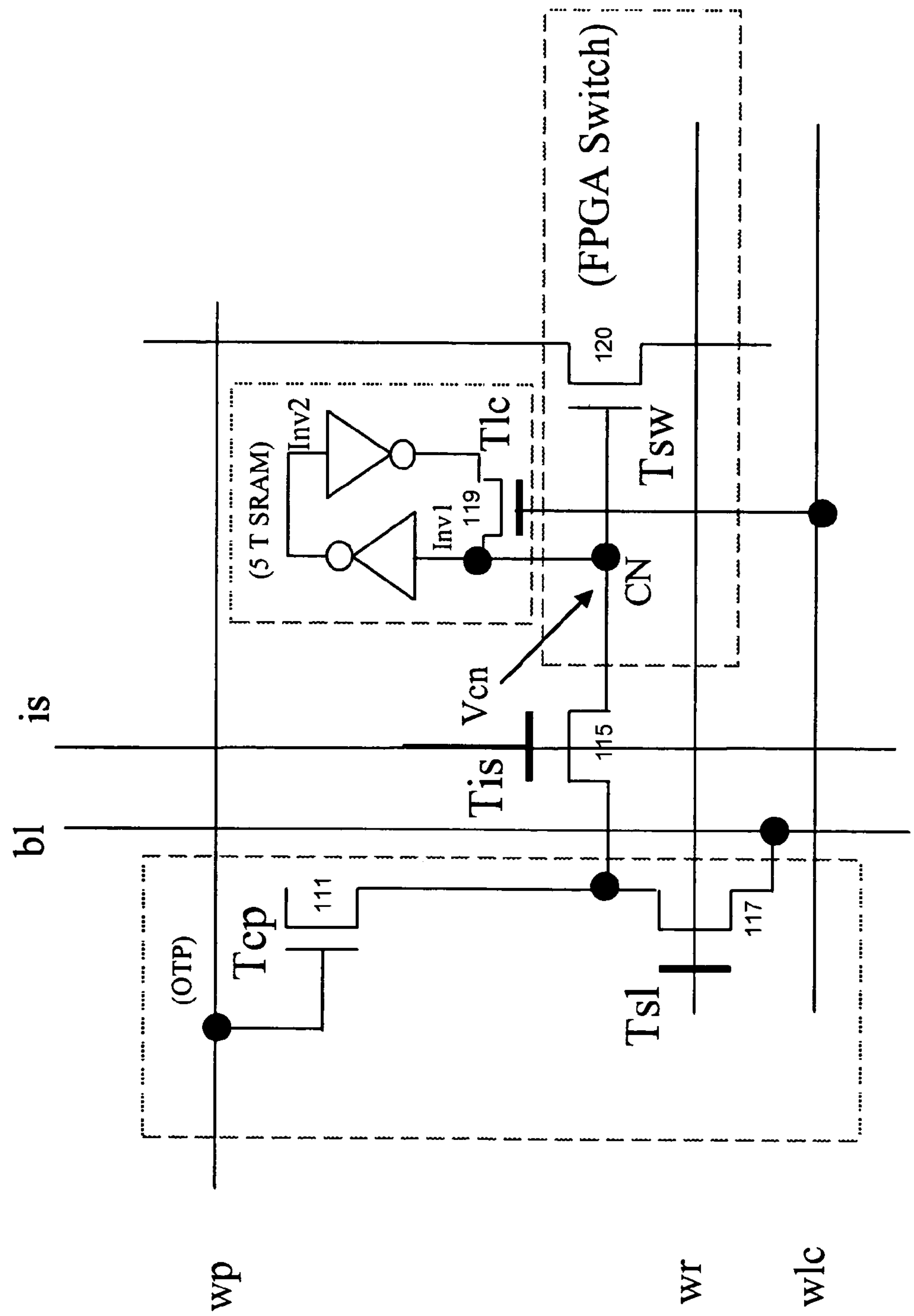
FIG. 13 is a schematic circuit diagram showing an alternative configuration of the memory cell of FIG. 2.

FIG. 13 is a schematic circuit diagram showing an alternative configuration of the memory cell of FIG. 2. In this embodiment, as an example, Tcp (half-transistor 111) and Inv1 and Inv2 and Tsw (transistor 120) are 1.8V devices (Gox~30A physical), and Tis (transistor 115), Tsl and Tlc (transistor 119) are 3.3V devices (Gox 60~75A). In other implementations, Trd, Tlc and/or Tis can be 1.8V devices or same device as Tcp, Ivn1, Inv2 and Tsw. The logic signal passes through Tsw (Vlogic)=Vcn−Vtsw in order to pass full logic "1". The oxide thickness and voltage can be scaled up or down according to different process technologies and applications. By moving Tis to between the OTP memory unit and the FPGA switch Tsw, Tis can isolate the $V_{pp}$ from stressing the thin gate oxide of Tsw and the Inverter.

Figure 14:
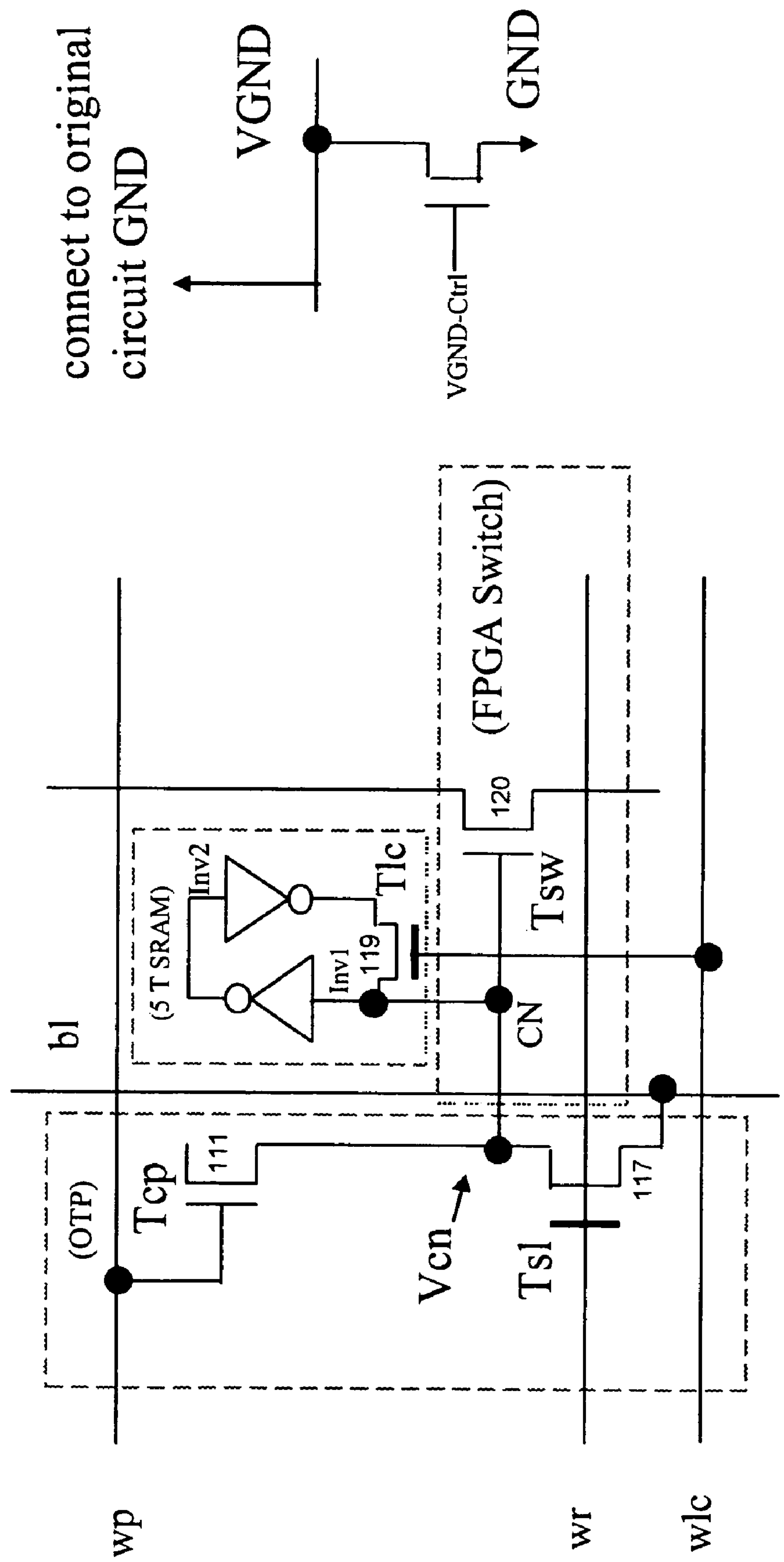
FIG. 14 is a schematic circuit diagram showing a simplified version of the memory cell of FIG. 13, which uses a virtual ground to prevent programming voltage stress on the switch gate oxide, such that the isolation device can be removed.

FIG. 14 is a schematic circuit diagram showing a simplified version of the memory cell of FIG. 13 in which transistor 115 (Tis) is removed from the circuit. In the embodiment of FIG. 13, Tis isolates the high voltage $V_{pp}$ from stressing the thin gate oxide of Tsw and the Inverter. By biasing the circuit GND (ground) to $V_{dd}$ or $V_{pp}/2$ to achieve the so-called virtual ground (VGND) during the programming, Tis can be removed. In this embodiment, as an example, Tcp and Inv1 and Inv2 and Tsw are 1.8V devices (Gox~30A physical), and Tsl and Tlc are 3.3V devices (Gox 60~75A). In other implementations, Trd, Tlc and/or Tis can be 1.8V devices or same device as Tcp, Ivn1, Inv2 and Tsw. The logic signal passes through Tsw (Vlogic)=Vcn−Vtsw in order to pass full logic "1". The oxide thickness and voltage can be scaled up and down according to different process technologies and applications.

Figure 15:
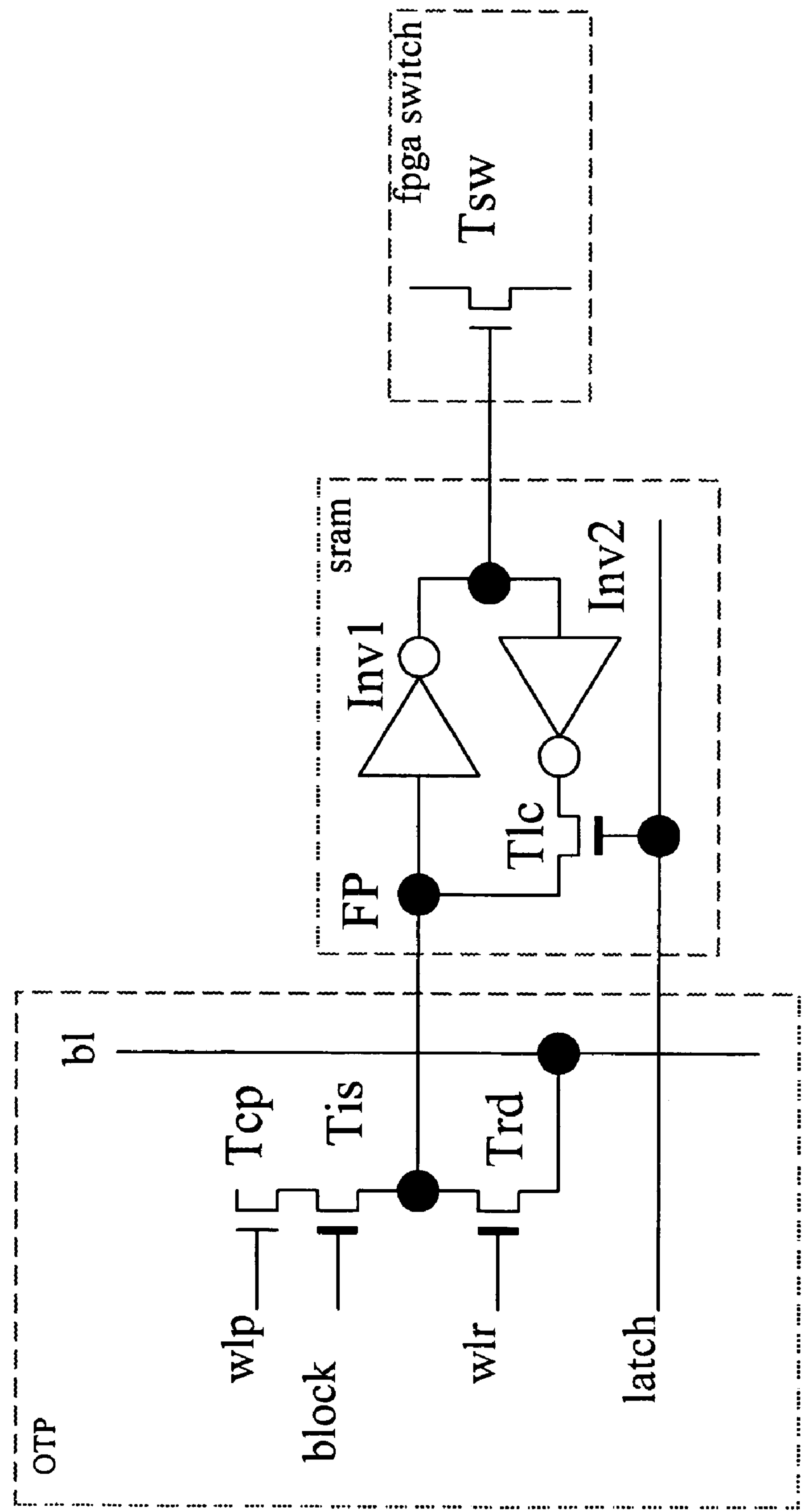
FIG. 15 is a schematic circuit diagram showing yet another configuration of the memory cell in which the SRAM part is any size SRAM.

FIG. 15 is a schematic circuit diagram showing yet another configuration of the memory cell in which the SRAM part represents any size SRAM. The SRAMs in previous figures were 5-transistor SRAMs, however, as illustrated in FIG. 15, any SRAM construction may be employed instead. In this embodiment, as an example, Tcp and Inv1 and Inv2 and Tsw are 1.8V devices (Gox~30A physical), and Tis, Trd and Tcl are 3.3V device (Gox~60-70A). The logic signal passes through Tsw (Vlogic)=Vfp−Vtsw in order to pass a full logic "1". The embodiment of FIG. 15 also depicts the control signal to the FPGA switch (gate of Tsw) to be taken from an opposite side of the SRAM.

Figure 16:
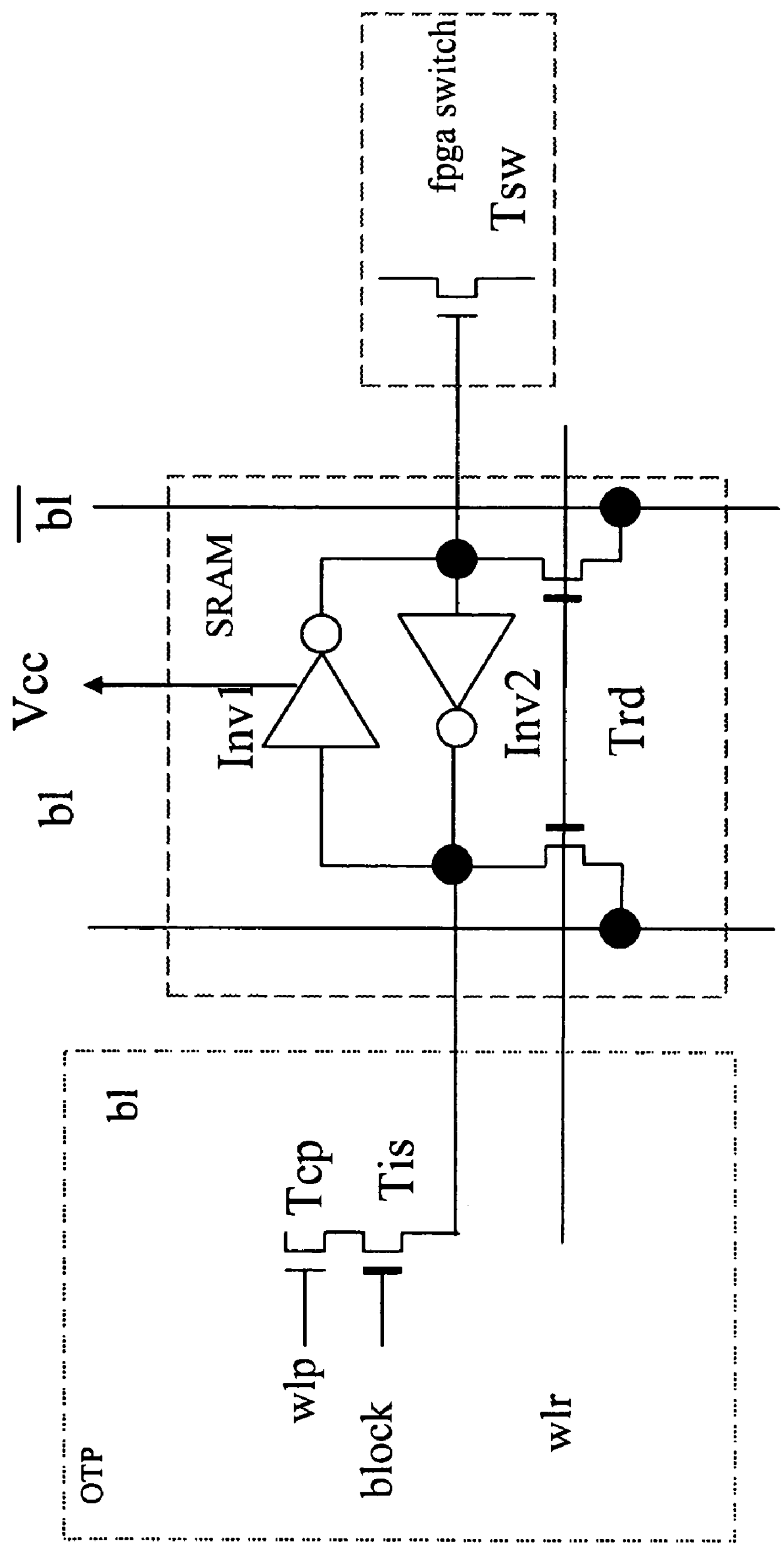
FIG. 16 is a schematic circuit diagram showing the memory cell using a regular double port SRAM.

FIG. 16 is a schematic circuit diagram showing the memory cell using a regular double port SRAM.

Figure 17:
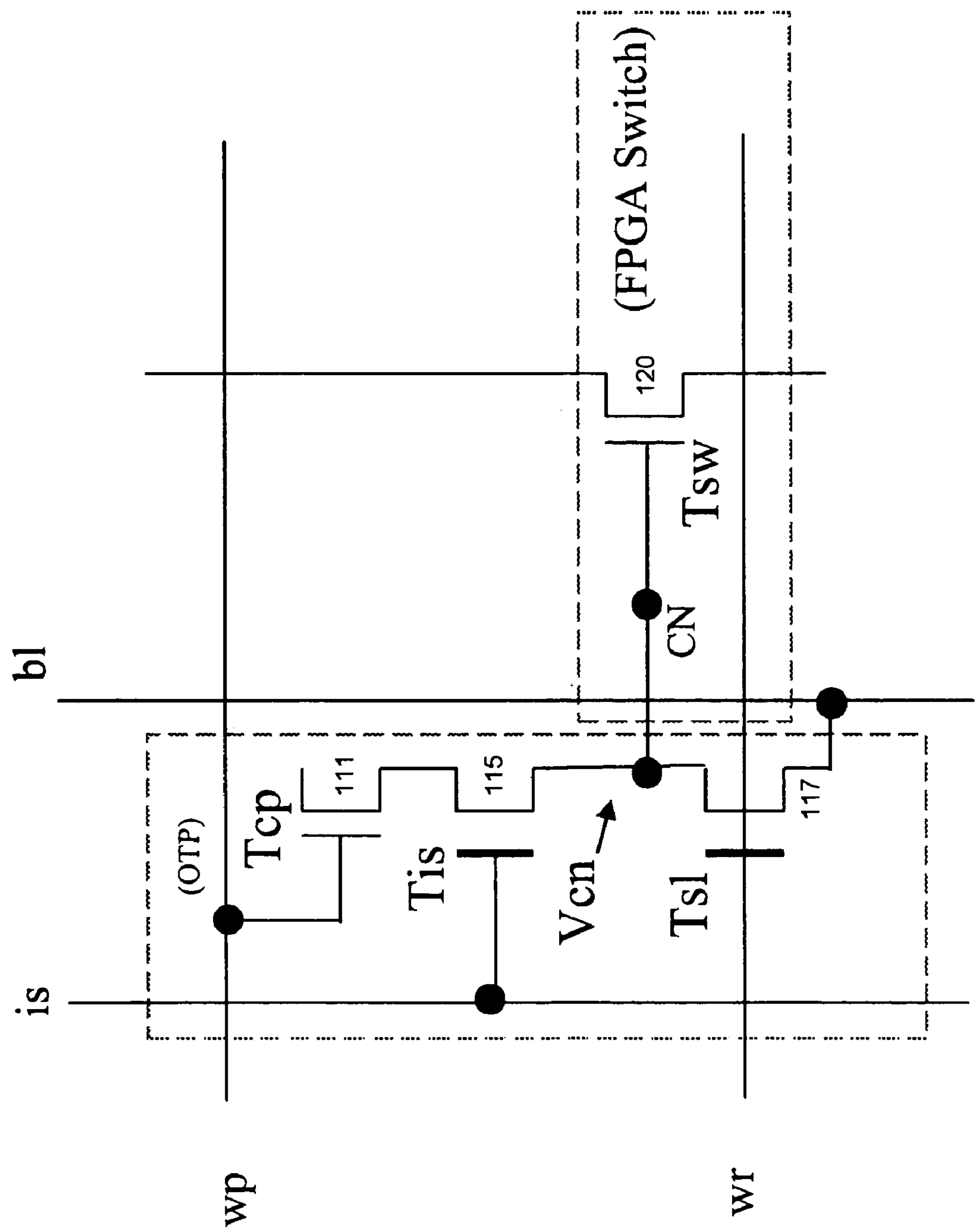
FIG. 17 is a schematic circuit diagram showing the memory cell with SRAM removed.

FIG. 17 is a schematic circuit diagram showing the memory cell with the SRAM unit removed. This embodiment is one-time programmable but occupies a smaller silicon space. For example once prototyping is concluded and the code for memory cells is finalized, the SRAM units can be eliminated from the memory cells and volume production may produce cells comprising only OTP units. In this implementation, as an example, Tcp and Inv1 and Inv2 and Tsw are 1.8V devices (Gox~30A physical), and Tis, Tsl and Tlc are 3.3V devices (Gox 60~75A). In other implementations, Tsl, and/or Tis can be 1.8V devices or same device as Tcp and Tsw. The oxide thickness and voltage can be scaled up and down according different process technologies and applications.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. When the claims use the word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims. For example the invention is not limited to the embodiments herein.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

The invention claimed is:

1. A configurable memory cell comprising:

means for one-time-programming (OTP), wherein the means for OTP is programmable and readable partly through a first control line;

means for connecting the OTP means to a control node, wherein the connecting is through a second control line;

means for repeatable programming, wherein the means for repeatable programming is readable, writable, and connectable to the control node partly through a third control line;

means for connecting the control node to a bit-line, wherein the means for connecting the control node to a bit-line is controlled by a forth control line, and wherein the bit-line is used for writing into the OTP and the repeatable programming means as well as for reading contents of the OTP and the repeatable programming means; and a configuration wherein by connecting predetermined voltages to the bit-line and the first, the second, the third, and the forth control lines, the control node will be connected to the OTP means, the repeatable programming means, the bit-line, or to any combination thereof for device stress management and for multiple read, write, and programming options.

2. The memory cell of claim 1, wherein the means for all operations are constructed by MOS transistors.

3. The memory cell of claim 1, wherein the OTP means and the means for connecting the OTP means to the control node are replaced by a floating gate device or by a flash memory.

4. The memory cell of claim 1, wherein the means for connecting the control node to the bit-line connects the OTP means to the bit-line instead.

5. The memory cell of claim 1, wherein the means for connecting the OTP means to the control node is eliminated and the OTP means is directly connected to the control node.

6. A memory cell comprising:

a one-time-programmable(OTP) memory element, wherein the OTP memory element is programmable and readable partly through an OTP control line;

a first switch controlled by a first control line for connecting the OTP memory element to a control node;

a static random access memory (SRAM) element controlled by an SRAM control line and controllably connected to the control node; and a configuration wherein by applying predetermined voltages to a bit-line and the first control line, the OTP control line, and the SRAM control lines, the control node will be connected to the OTP memory element, the SRAM memory element, the bit-line, or to any combination thereof for device stress management and for multiple read, write, and programming options.

7. The memory cell of claim 6, wherein the read, write, and programming options comprise:

programming or reading the content of the OTP memory element;

writing into or reading the content of the SRAM element;

programming the data content of the SRAM element directly into the OTP memory element;

writing the data content of the OTP memory element directly into the SRAM element;

connecting the data content of the SRAM element to the control node while isolating the OTP memory element from the control node; or connecting the data content of the OTP memory element to the control node while isolating the SRAM element from the control node.

8. The memory cell of claim 6, wherein the OTP memory element is a MOS half-transistor, the first switch is a MOS transistor and the SRAM memory element is single port.

9. The memory cell of claim 6, wherein the OTP memory element and the first switch are replaced by a floating gate device or by a flash memory.

10. The memory cell of claim 6, wherein the first switch is eliminated and the OTP memory element is directly connected to the control node.

11. The memory cell of claim 6, wherein the control node is used for controlling a field programmable gate array (FPGA) switch.

12. The memory cell of claim 8 wherein the 5 transistor SRAM consists of two inverters and one latch transistor connected serially in a loop.

13. The memory cell of claim 6, wherein the SRAM element is replaced by a double port SRAM.

14. The memory cell of claim 6, wherein the SRAM element is removed for volume manufacturing.

15. A field programmable gate array (FPGA), comprising at least one memory unit configured for volatile and non-volatile programming and configured to perform as a single memory cell or as a part of an array of memory cells, wherein the memory unit content controls at least one FPGA switch, and wherein the memory unit includes:

a one-time-programming (OTP) memory element programmable and readable partly by an OTP control line;

a first switch for connecting the OTP memory element to a control node, wherein the first switch is controlled by a first control line;

a static random access memory (SRAM) element controllably connectable to the control node, wherein the connection to the control node and SRAM read and write operations are controlled by an SRAM control line; and a second switch for connecting the control node to a bit-line, wherein the bit-line is used for writing into the memory elements as well as reading the memory elements contents, wherein the second switch is controlled by a second control line, and wherein by applying appropriate voltages to the bit-line and the first, the second, the OTP, and the SRAM control lines:

the OTP memory element is programmed or read;

the SRAM element is written into or read;

the data content of the SRAM element is directly programmed into the OTP memory element;

the data content of the OTP memory element is directly written into the SRAM element;

the data content of the SRAM element is connected to the control node while the OTP memory element is isolated from the control node; and the data content of the OTP memory element is connected to the control node while the SRAM element is isolated from the control node.

16. The FPGA of claim 15, wherein the SRAM memory element is a five-transistor single port SRAM with a loop of two cross-coupled inverters and one of the transistors in the cross-couple loop, and wherein the inventers use minimum device size.

17. The FPGA of claim 15, wherein the OTP memory element is a MOS half-transistor and the first switch is a MOS transistor, or wherein the OTP memory element and the first switch are together replaced by another nonvolatile cell, by a Flash cell, or by an EEPROM cell.

18. The FPGA of claim 15, wherein the second switch connects the OTP memory element to the bit-line instead of connecting the control node to the bit-line.

19. The FPGA of claim 15, wherein the first switch is eliminated and the OTP memory element is directly connected to the control node, and wherein during the programming the memory circuit ground is biased to $V_{dd}$ or to half of the voltage at the OTP control line to reduce device stress.

20. The FPGA of claim 15, wherein a point in the SRAM element other than the point connected to the control node is used for controlling the FPGA switch.

21. The FPGA of claim 15, wherein the SRAM element is replaced by a regular double port SRAM, and wherein the second switch is replaced by one of the two transistors of the double port SRAM.

22. The FPGA of claim 15, wherein the SRAM element is removed for volume manufacturing.

23. The FPGA of claim 15 wherein said first switch can be a transmission gate switch with a PMOS gate connect to the SRAM element.

24. A method of storing data in a memory unit, wherein the memory unit is utilized as a storage element or as a switch control element, the method comprising:

controllably connecting a first terminal of a two-terminal OTP memory element to a control node, wherein exposing the OTP memory element to a predetermined voltage programs the OTP memory element;

controllably connecting an SRAM memory element to the control node;

controllably connecting a data line to the control node; and controlling the connections depending on desired operations, wherein:

to read or to permanently program the OTP memory element from outside, isolating the SRAM element from the control node, connecting the OTP element and the data line to the control node, applying appropriate voltage to the second terminal of the OTP element and sensing the data line for reading, and applying appropriate voltage between the data line and the second terminal of the OTP element for programming;

to read or to temporarily write into the SRAM memory element from outside, isolating the OTP element from the control node, connecting the SRAM element and the data line to the control node, sensing the data line for reading, and applying appropriate voltage to the data line for writing;

to permanently program the OTP memory element using the data in the SRAM element or to write into the SRAM memory element using the data in the OTP element, isolating the data line from the control node, connecting the OTP and the SRAM elements to the control node, applying appropriate voltage to the second terminal of the OTP element; and to control a switch by the memory unit, connecting the switch to the control node, isolating the data line from the control node, connecting the OTP or the SRAM element to the control node as desired, applying appropriate voltage to the second terminal of the OTP element if the OTP element is connected to the control node.

* * * * *